| (12) | United States Patent<br>Agarwal | (10) Patent No.: US 7,171,599 B2<br>(45) Date of Patent: Jan. 30, 2007 |
|---|---|---|

(54) FIELD PROGRAMMABLE DEVICE

(75) Inventor: Deepak Agarwal, High Wycombe (GB)

(73) Assignee: STMicroelectronics Limited, Buckinghamshire (GB)

( * ) Notice: Subject to any disclaimer, the term of this patent is extended or adjusted under 35 U.S.C. 154(b) by 486 days.

(21) Appl. No.: 10/406,058

(22) Filed: Apr. 2, 2003

(65) Prior Publication Data

US 2003/0221151 A1 Nov. 27, 2003

(30) Foreign Application Priority Data

Apr. 3, 2002 (EP) .................................. 02252426

(51) Int. Cl.
*B01R 31/28* (2006.01)
*G06F 7/02* (2006.01)

(52) U.S. Cl. ..................................................... 714/725
(58) Field of Classification Search ................ 714/725, 714/724, 819; 326/37, 38, 41, 47; 365/201, 365/189.07
See application file for complete search history.

(56) References Cited

U.S. PATENT DOCUMENTS

| 5,347,519 | A |   | 9/1994 | Cooke et al. .............. 371/22.2 |
| 5,768,288 | A | * | 6/1998 | Jones ......................... 714/725 |
| 5,815,510 | A |   | 9/1998 | Jones et al. ................ 371/22.1 |
| 6,037,800 | A | * | 3/2000 | Trimberger .................. 326/38 |
| 6,237,124 | B1 |  | 5/2001 | Plants ......................... 714/763 |
| 6,300,769 | B1 |  | 10/2001 | Phan ........................... 324/537 |
| 2002/0141234 | A1 | * | 10/2002 | Kaviani ....................... 365/181 |

FOREIGN PATENT DOCUMENTS

WO  WO 01/86313 A1  11/2001

OTHER PUBLICATIONS

EPO; European Search Report for 02252426.8; Aug. 2, 2002.

* cited by examiner

*Primary Examiner*—Phung My Chung
(74) *Attorney, Agent, or Firm*—Jenkens & Gilchrist, PC

(57) ABSTRACT

A field programmable device is disclosed, including a plurality of logic blocks; a plurality of connections connecting the logic blocks; configuration circuitry for outputting configuration data for programming the field programmable device, the configuration circuitry providing at least one pair of outputs; and error detection circuitry for comparing the outputs to determine if there has been a configuration error.

41 Claims, 8 Drawing Sheets

FIELD PROGRAMMABLE DEVICE

BACKGROUND OF THE INVENTION

1. Technical Field of the Invention

The present invention relates to a field programmable device (FPD) and in particular but not exclusively to Field Programmable Gate Arrays (FPGA).

2. Description of Related Art

Programmable gate arrays (PGA) have dramatically changed the process of designing digital hardware over the last few years. Unlike previous generations of digital electronic technology, where board level designs included large numbers of integrated circuits containing basic gates, virtually every digital design produced today consists mostly of high density integrated circuit devices. This is applied not only to custom devices such as processing units and memory, but also to solid state machines such as controllers, counters, registers and decoders.

When such circuits are destined for high volume systems, they have been integrated into high density gate arrays. However, for prototyping or other low volume situations, many product designs are built using field programmable devices (FPD), one variant of which are field programmable gate arrays (FPGA). A field programmable device such as the FPGA is at its most basic level a series of configurable logic blocks (CLB), interconnected by a series of configurable connections or links, and read from and written to by a configurable input/output device.

The effectiveness of a field programmable device is the ability of the device to represent a required digital design, and be capable of being altered without the need for complete replacement. This ability is dependent on several factors such as device speed, and the complexity of design capable of being simulated. The complexity of the design is itself dependent on the complexity of the interconnections between the configurable logic blocks, and the number of the configurable logic blocks. The greater the number of blocks and the more complex the interconnection environment, the more complex the design that can be realized.

Interconnects are generally programmed, in the case of memory based FPDs, by a series of switching matrices controlled by memory latches. The memory latches create closed or open circuits between pairs of conducting lines. These configuration latches are supplied configuration data from a series of configuration registers and are enabled by an address register in a manner similar to the addressing and writing to a typical memory cell. The address and configuration data are passed to the configuration latches by a series of configuration and address lines.

In order to test that the configuration has been carried out successfully, a verification step is typically introduced after configuration and prior to using the device in an active mode. This verification step involves using a series of test input signals, or test vectors, and monitoring the output of the FPD. The output of the simulated circuit is checked against the test vector input to enable the verification step to determine if a configuration error has occurred and if enough test vectors are entered, the verification step may determine which region or which configuration latch has failed.

This verification step therefore increases the time spent in the configuration mode. Also should any errors be detected the device has to restart the whole configuration cycle again. Solutions for detecting an error in data stored in configuration SRAM and user assignable SRAM in a FPGA have been proposed. U.S. Pat. No. 6,237,124 describes such a method. This method, though, describes separate write and read phases. The write phase describes a method for writing to configuration SRAM and also using the same data into Cyclic Redundancy Check (CRC) circuitry. The read phase describes when data is read from the configuration SRAM and fed into the same CRC circuitry, then comparing the CRC values to determine if there is a fault. This method therefore requires two phases in order to perform a single test. In other words, a write phase is required to initiate the test followed by a read phase to trigger the test value. This test is also unable to determine the exact location of the fault.

Based upon the foregoing, there is a need for a field programmable device that is efficiently configured and verified.

SUMMARY OF THE INVENTION

Embodiments of the present invention overcome the shortcomings described above and satisfy a need for an improved field programmable device that is efficiently configured and verified.

Embodiments of the present invention at least mitigate the problems described above.

There is provided, according to embodiments of the invention, a field programmable device including a plurality of logic blocks; a plurality of connections connecting the logic blocks; configuration means for outputting configuration data for programming the device, the configuration means providing at least one pair of outputs; and error detection means for comparing the outputs to determine if there has been a configuration error.

The error detecting means may include means for comparing the outputs. In an embodiment of the present invention, the comparing means may be a logic XNOR gate.

The error detection means may be arranged to determine the presence of an error if a pair of outputs are determined to be the same. The error detection means may include at least one transistor arranged to provide a predetermined output when an error is determined. The at least one transistor may be a pull-up transistor.

The device may further comprise at least one pair of outputs comprising a signal and its logical inverse.

The error detection means may be arranged to determine errors in a first part of the device and then determine errors in a second part of the device. The error detection means may be arranged to determine errors in the first part when a clock signal has a first state and determine errors in the second part when the clock signal has a second state.

One of the first and second parts of the device may include the outputs of the configuration means. One of the first and second parts of the device may include the plurality of connections. At least one of the logic blocks and the connection means may be configurable.

The error detection means may be arranged to determine the location of an error.

The error detection means may include means for providing an output for each line of the device. The means for providing an output for each line may include storage means. The means for providing an output for each line may include comparing means.

Embodiments of the present invention allow the testing of configuration data to be carried out at substantially the same time as the act of configuring the device.

BRIEF DESCRIPTION OF THE DRAWINGS

For a better understanding of the present invention and how the same may be carried into effect, reference will now be made by way of example only to the accompanying drawings in which.

DETAILED DESCRIPTION OF THE EMBODIMENTS OF THE PRESENT INVENTION

Figure 1:
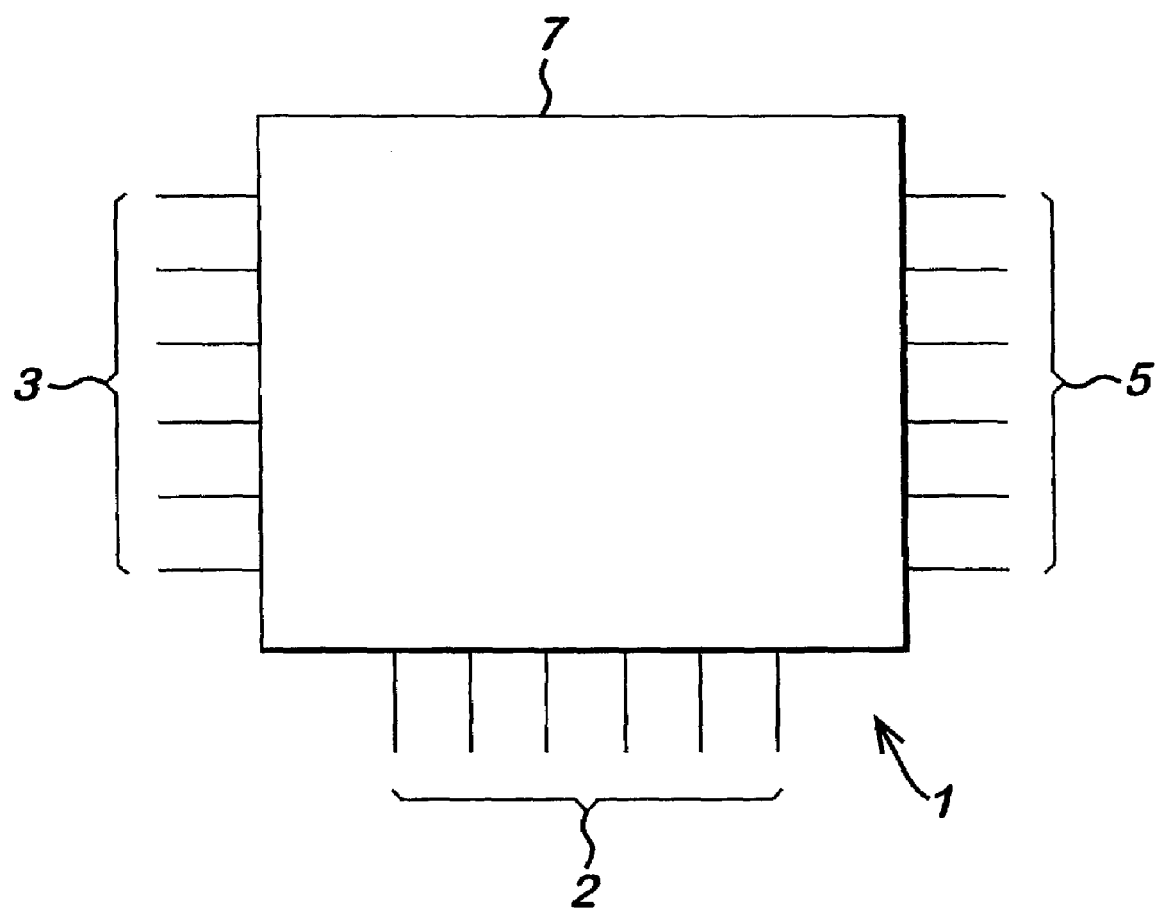
FIG. 1 shows a schematic view of a field programmable device.

Reference is now made to FIG. 1, which shows a field programmable device 1 within which embodiments of the present invention can be implemented. The Field Programmable Device (FPD) 1 may include a digital logic device 7, and a series of pins providing connections to and from the logic device. These pins are bi-directional or uni-directional and may be defined in each specific design. For example, in FIG. 1 pins 3 provide digital signals to the logic device, i.e., inputs. Pins 5 provide digital signals from the logic device, i.e., outputs.

The FPD 1 may be capable of being operated in one of two modes. The first mode is an active mode, whereby the device simulates the action or actions of a digital or a series of digital circuits. The logic device 7 may receive inputs via the input pins 3 and provide outputs via the output pins 5, whereby these inputs may provide digital data and/or a clock signal.

The second mode is a configuration mode. In this mode, the logic device 7 is configured dependent on input data. When configured, the logic device 7 is arranged to simulate the action of the required digital circuit or circuits. This configuration input data may be passed to the logic device 7 via the input pins 3 or output pins (acting as input pins) 5 or by a separate series of configuration pins 2.

Figure 2:
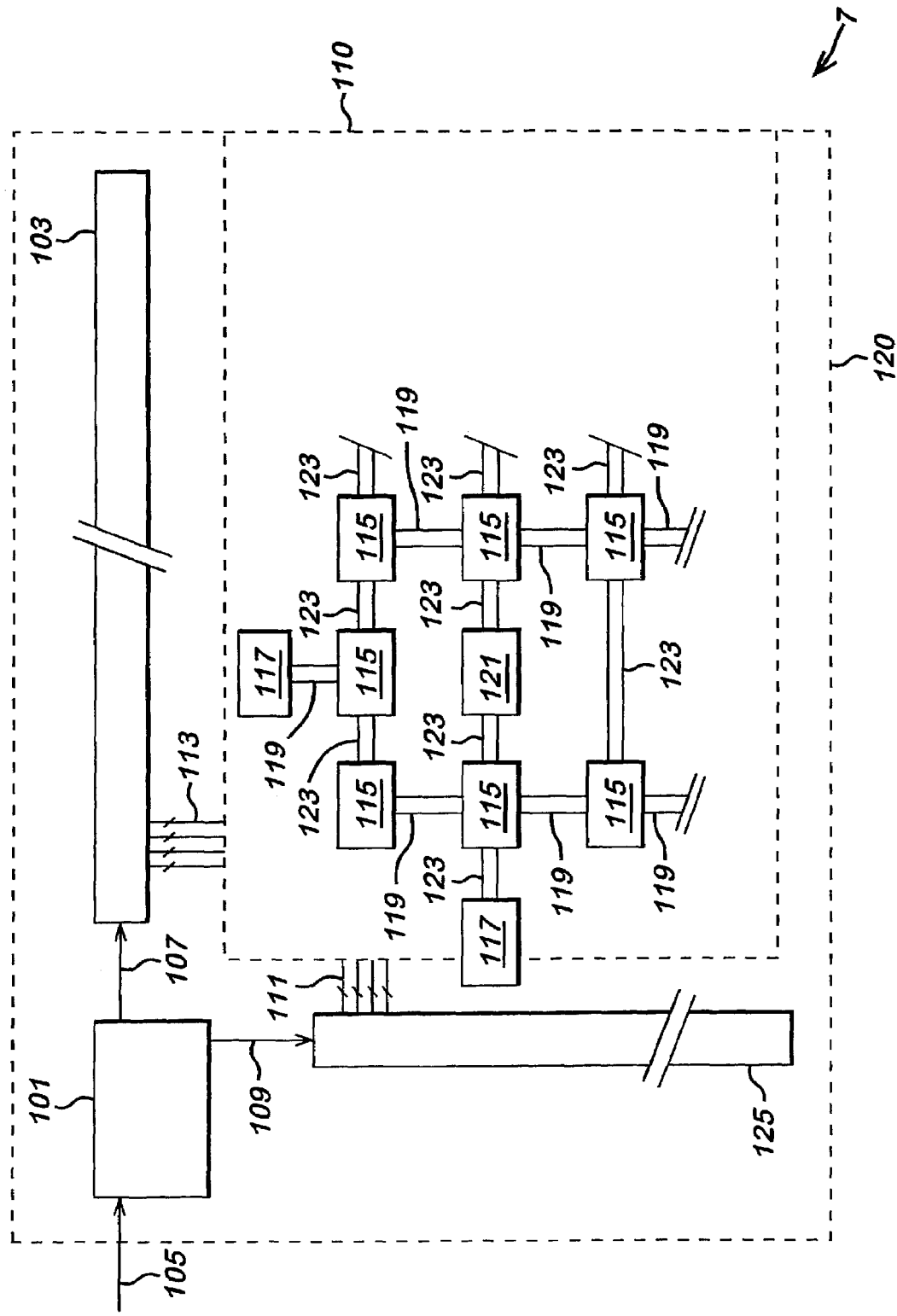
FIG. 2 shows a detailed view of a logic device in the field programmable device of FIG. 1.

With reference to FIG. 2 which shows the FPD 1 in more detail, the logic device 7 may include a processing block 110 which comprises the elements needed to allow the FPD 1 to simulate the required circuit. In order to communicate to devices outside the FPD 1, a series of Input/Output Blocks (IOB) 117 are provided at the edges of the processing block 110. These IOBs 117 are configurable to be capable of buffering signals received from and output to the FPD connection pins 3,5. The IOBs 117 are connected to the rest of the processing block 110 by a plurality of vertical conductive paths (or vertical data lines) 119, and horizontal paths (or horizontal data lines) 123. These conductive paths run in vertical and horizontal directions and substantially span the processing block 110 of the logic device 7.

These conductive paths 119 and 123 pass through a series of Switching Matrices (SM) 115. The intersection of vertical paths 119 and horizontal paths 123 create short or open circuits, connecting or isolating the paths 119 and 123 in dependence on the configuration of the corresponding switching matrix 115. The switching matrix 115 thus allows a vertical path 119 to be connected to a horizontal path 123, allows a horizontal path 123 to pass through the switch matrix 115, and/or allows a vertical path 119 to pass through the switch matrix 115.

These conductive paths, 119 and 123, also pass information and/or data to and from the terminals of the Configurable Logic Blocks (CLB) 121. The arrangement of the Configurable Logic Blocks 121 and switched matrices 115 is normally such that no two CLBs 121 are directly connected together by a single conductive path 119,123. Therefore, signals from one CLB 121 to another CLB 121 are routed via switched matrices 115. An alternate arrangement in some areas of the processing block 110 allows direct connections between CLBs 121 in some circumstances.

The CLB 121 may include in a first stage a series of look up tables outputting values in dependence on a series of inputs, coupled to a second stage where the values of these look up tables are logically combined or selected in dependence on the configuration of that particular CLB 121.

In order to configure both the Switched Matrix 115 and the Configurable Logic Block 121, additional circuitry may be required. This circuitry is featured in the configuration block 120. The circuitry of the configuration block 120 may include a configuration controller 101, a configuration data register 125 and address register 103. The configuration controller 101 controls the configuration within the FPD 1. The configuration controller 101 receives signals 105 via the configuration pins 2. The controller 101 can instruct the address registers 103 and configuration data registers 125 via an address register conductive path 107 and a configuration register conductive path 109, respectively. Configuration data, as well as instructions from the controller 101, can also be loaded onto the configuration data register 125 via the same configuration register conductive path 109.

The configuration data is stored in the configuration data register 125 and output to the elements in the processing block 110 on a series of configuration data lines 111. The data is directed to the correct part of the processing block 110 in dependence on the signals output from the address register 103 via the address lines 113. These address lines 113 and configuration data lines ill intersect the processing block 110, spanning substantially all of the configurable elements in the processing block 110 (not shown for clarity purposes).

Figure 3:
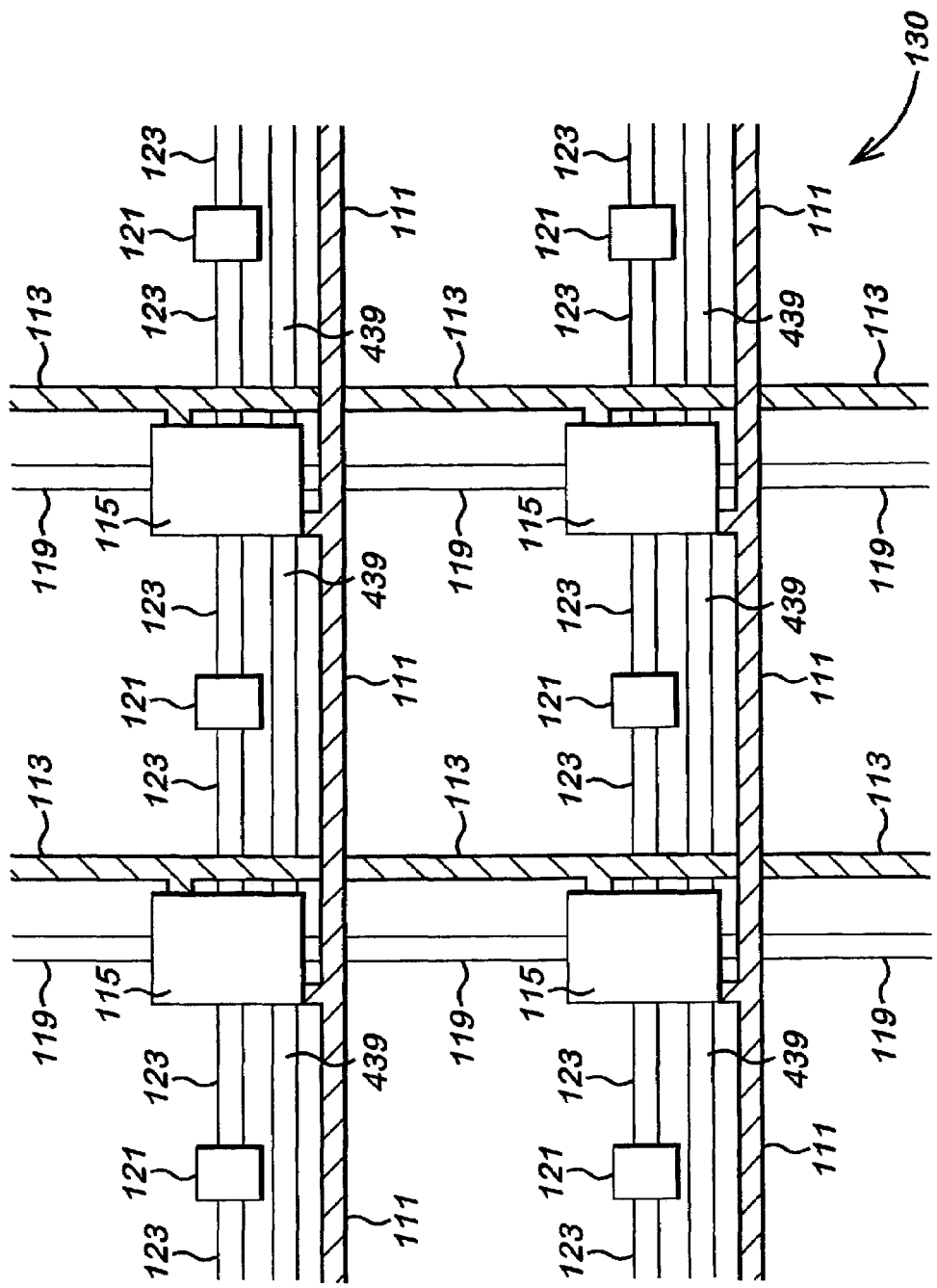
FIG. 3 shows a view of the interconnections of the configuration and data paths in the field programmable device of FIG. 1.

FIG. 3 shows in more detail a part 130 of the processing block 110. Configurable Logic Blocks 121 are connected to each other via horizontal conductive paths 123 and vertical 119 conductive paths. Connecting paths together and routing pathways on these conductive paths, 119 and 123, are the switching matrices 115. The switching matrices 115 are also connected to the configuration data lines 111 and the address lines 113, which run substantially continuously across the processing block 110.

Figure 4:
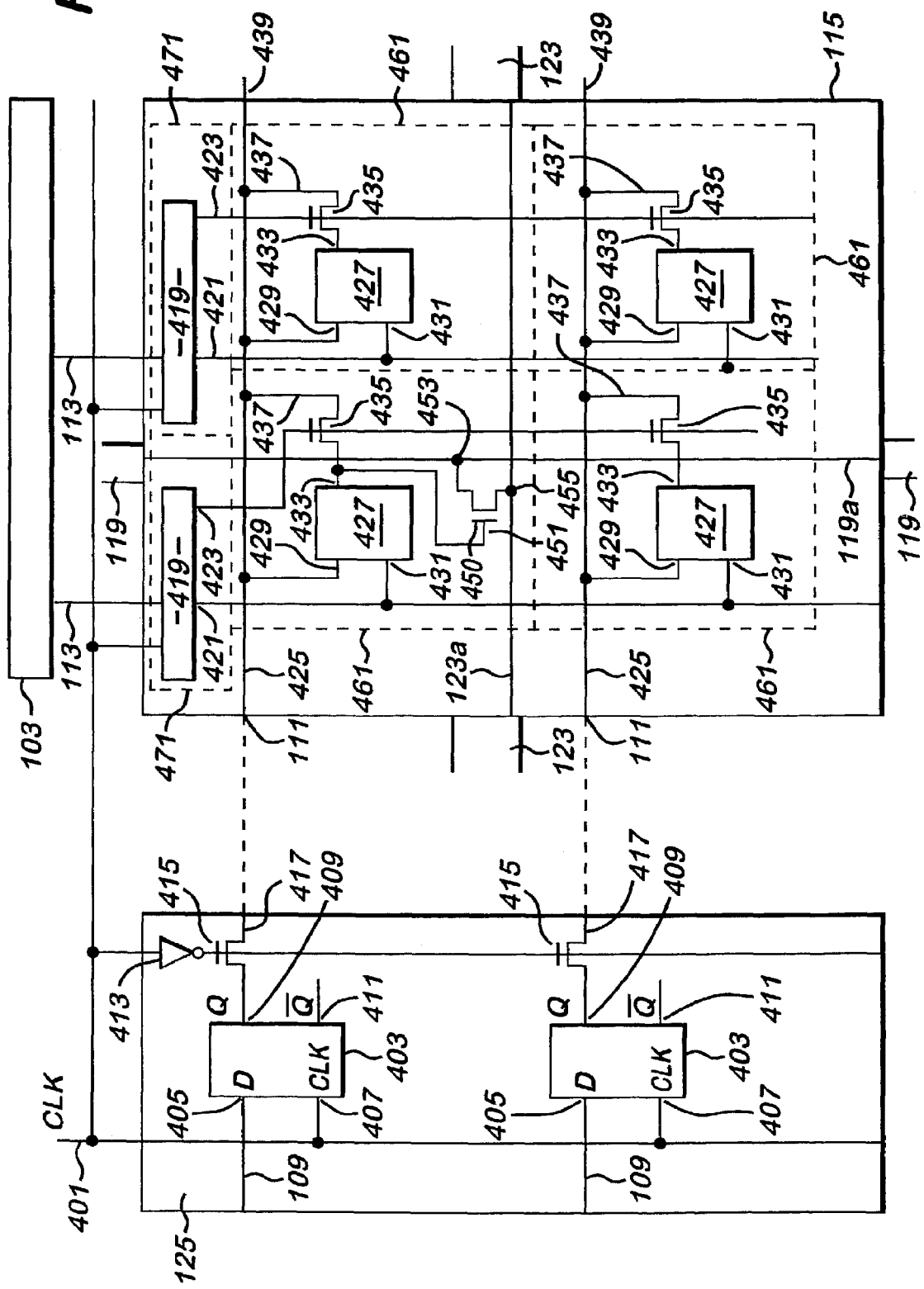
FIG. 4 shows a switch matrix element capable of being implemented in the logic device of FIG. 3.

FIG. 4 shows in further detail the circuitry used to configure the switch matrix 115. A switch matrix 115 may include a plurality of horizontal data lines 123, a plurality of vertical data lines 119, a plurality of configuration data lines 425, a plurality of address lines 113, a plurality of enable signal generators 419, a plurality of configuration latches 427, a plurality of connecting transistors 450 and a plurality of output switch transistors 435.

The horizontal data lines 123 may pass through the switch matrix 115 from one horizontal side to the opposite side (of which one horizontal data line 123a is shown in FIG. 4).

The vertical data lines 119 may pass through the switch matrix 115 from one vertical side to the opposite vertical side (of which one vertical data line 19a is shown in FIG. 4).

The switch matrix configuration data lines 425 may pass through the switch matrix 115, entering on one side and being connected to the configuration data lines 111, and connected on the opposite side to a series of switch matrix configuration outputs 439.

The address lines 113 may enter the switch matrix 115, and pass along the switch matrix 115. The address lines 113 may in some embodiments of the present invention pass through the switch matrix 115 and exit the opposite side to continue the path of the address lines 113. Alternatively, with reference to FIG. 3 and FIG. 4, the address lines 113 may terminate within the switch matrix 115, with a path external to the switch matrix 115 connecting to each of the switch matrices 115.

The enable signal generator 419 has a first input connected to the clock signal line 401, a second input connected to an address signal 113, a first output connected to an input enable line 421 and a second output connected to an output enable line 423.

The configuration latch 427, has a first (data) input 429 connected to the switch matrix configuration data line 425, a second (enable) input 431 connected to the input enable line 421, and an output 433.

The connection transistor 450 has its gate 451 connected to the configuration latch output 433, one of its remaining terminals 453 connected to one of the vertical data lines 119a and the remaining terminal 455 connected to one of the horizontal data lines 123a.

The output switch 435 has its gate connected to the output enable line 423, one of the remaining terminals connected to the output 433 of the configuration latch 427, which has its enable input 431 connected to the input enable line 421 provided from the same enable signal generator 419 supplying the output enable line 423 connected to the gate of the output switch 435. The remaining terminal of output switch 435 is connected to the switch matrix configuration data line 425 which is connected to the data input 429 of the configuration latch 427 of which the output 433 is connected to the other terminal of output switch 435.

The switched matrix 115 has an array of configuration latches. Each element 461 of this array may include a pair of enable lines, input enable 421 and output enable 423, switch matrix configuration data line 439 running horizontally through the element, a configuration latch 427 with the enable input connected to the input enable 421, and the data input 429 connected to the switch matrix configuration data line 425.

The output of the configuration latch 427 is passed to the output switch 435 which can pass the output back to the configuration line 425. The configuration latch output 433 is also passed to a connection switch 450 which can connect a horizontal data line to a vertical data line.

Each element 461 of the latch array is tiled together so that, vertically aligned elements receive the same input and output enable lines supplied by the column enable signal generator 471. Vertically aligned tiles also receive the same vertical data line. Horizontally aligned elements 461 receive the same switch matrix configuration data line 425, and the same horizontal data line 123.

In a typical field programmable device, the process of configuring is controlled from the configuration controller 101. The controller 101 controls the address register 103 and configuration data register 125. The configuration data register 125 may include a single column with a plurality of rows. Each row element controls the configuration data for a single configuration data line 111. Each row element may include a data configuration latch 403 and a switch 415.

The data configuration latch 403 may include a data input 405 connected to the configuration controller by the line or lines 109, an enable input 407 connected to a clock line 401, a first output 409 and a second output 411. The second output 411 is an inverted form of the first output 409.

The switch 415 may include three terminals, a data input, a data output and a select input. In FIG. 4, the switch 415 may be an NMOS transistor which has its gate functioning as the select input, one of the conduction terminals functioning as the data input, and the other conduction terminal functioning as the data output. The gate of the transistor of switch 415 is connected to an inverted clock pulse 415, such as provided by the output of an inverter 413, with the inverter's input connected to the clock line 401. The switch data input is connected to the first output 409 of the data configuration latch 403. The switch data output 417 is connected to a configuration data line 111.

Figure 5:
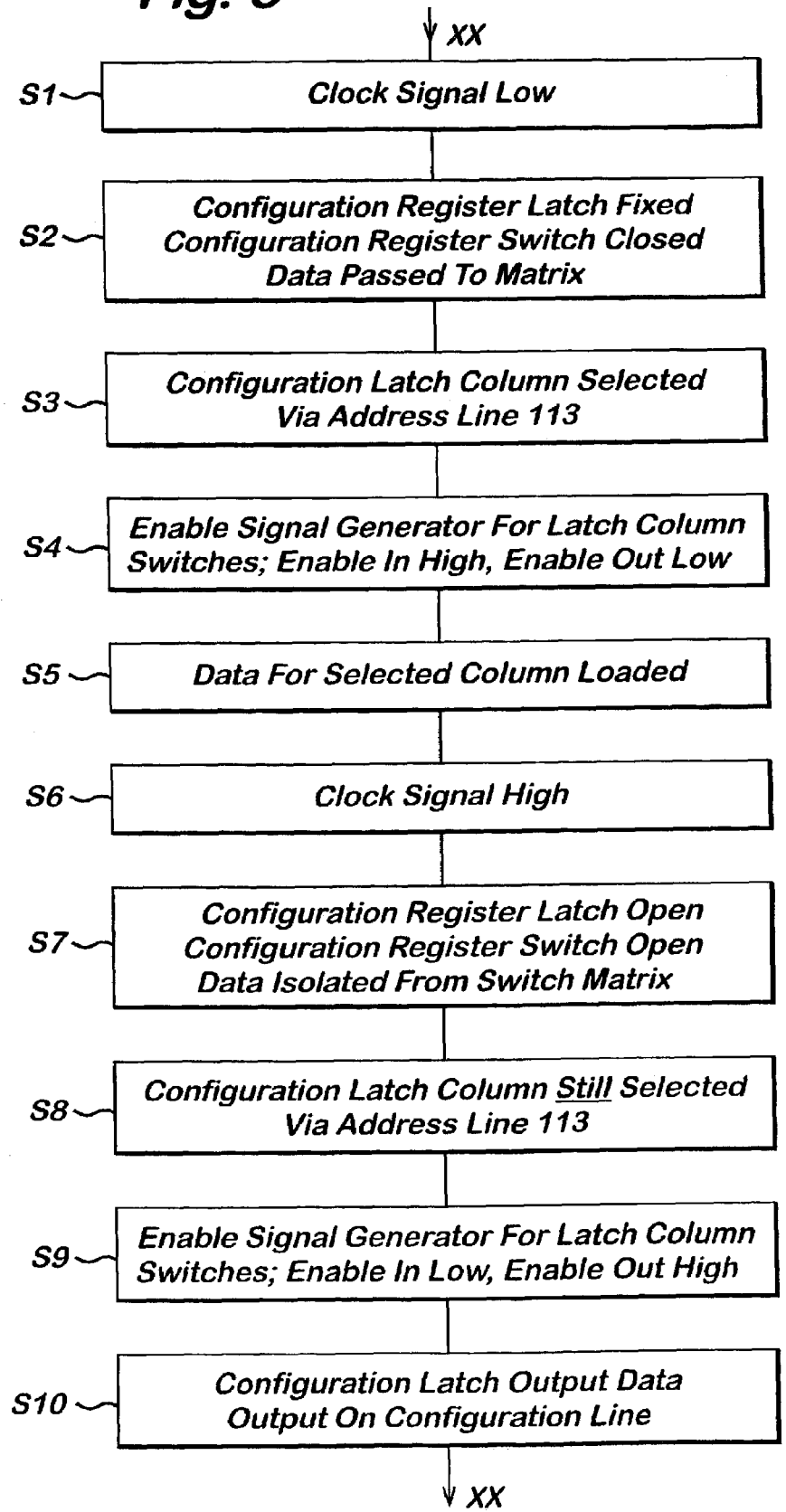
FIG. 5 shows a flow diagram showing the write/read cycle for a field programmable device utilizing the switching matrix of FIG. 4.

FIG. 5 shows the action of configuration and verification in an FPD utilizing the configuration circuitry of FIG. 4. In the first step S1, the clock signal is brought low. This allows, in step S2, the configuration latch 403 to be fixed and the configuration register switch transistor 415 to close. The data configuration latch output 409 is passed to the switch matrix 115 via the 'closed' configuration switch 415 and the configuration data lines 111.

Step S3 involves selecting one of the columns of elements 461 in a switch matrix to be written to. This is achieved by the address register 103 outputting a high signal on one of the address lines 113.

This assertion of an address line 113, along with the clock signal, is passed to the enable signal generator 419, which in step S4 switches the selected column enable input 421 high, and its enable output 423 low.

With the column enable input 421 high, the corresponding column of configuration latches 427 selected are now able to be loaded with configuration data. This configuration data is also passed through the switch matrix configuration lines 425. These functions are performed in step S5.

At step S6, the clock signal 401 is brought high.

The act of bringing the clock signal 401 high causes, in step S7, the configuration register latch 403 to open and accept new data. At substantially the same time, the configuration register switch 415 is also opened, isolating the configuration register latch output 409 from the configuration data lines 111.

The configuration latch 427 column to be read from is selected by outputting a high signal on the selected column address line 113. In the case of reading from the same line, the same column address line 113 is kept high. These functions are shown in step S8.

The selected column enable signal generator 419 now switches the enable input 421 to low and the enable output 423 to high as shown in step S9.

The switching of the states of the enable input 421 and enable output 423 closes the selected column output switch 435 and outputs the value from the output 433 of the configuration latch 427 onto the configuration data line 425, which is placed on the switch matrix output line 439.

As can be seen by such a series of steps, the act of writing configuration data and reading configuration data cannot be carried out at the same time. In such a method an additional storage means are required to store the original configuration data, store the configuration latch data and then perform tests based on the stored data.

There is also a lack of discrimination in the reading of the data. Data is read from the configuration latch 427, but it is not possible to determine where the error occurred within the configuration cycle. It is therefore not possible to determine if it is possible to amend the configuration design to compensate for the error, and if so how to compensate for the error.

Figure 6:
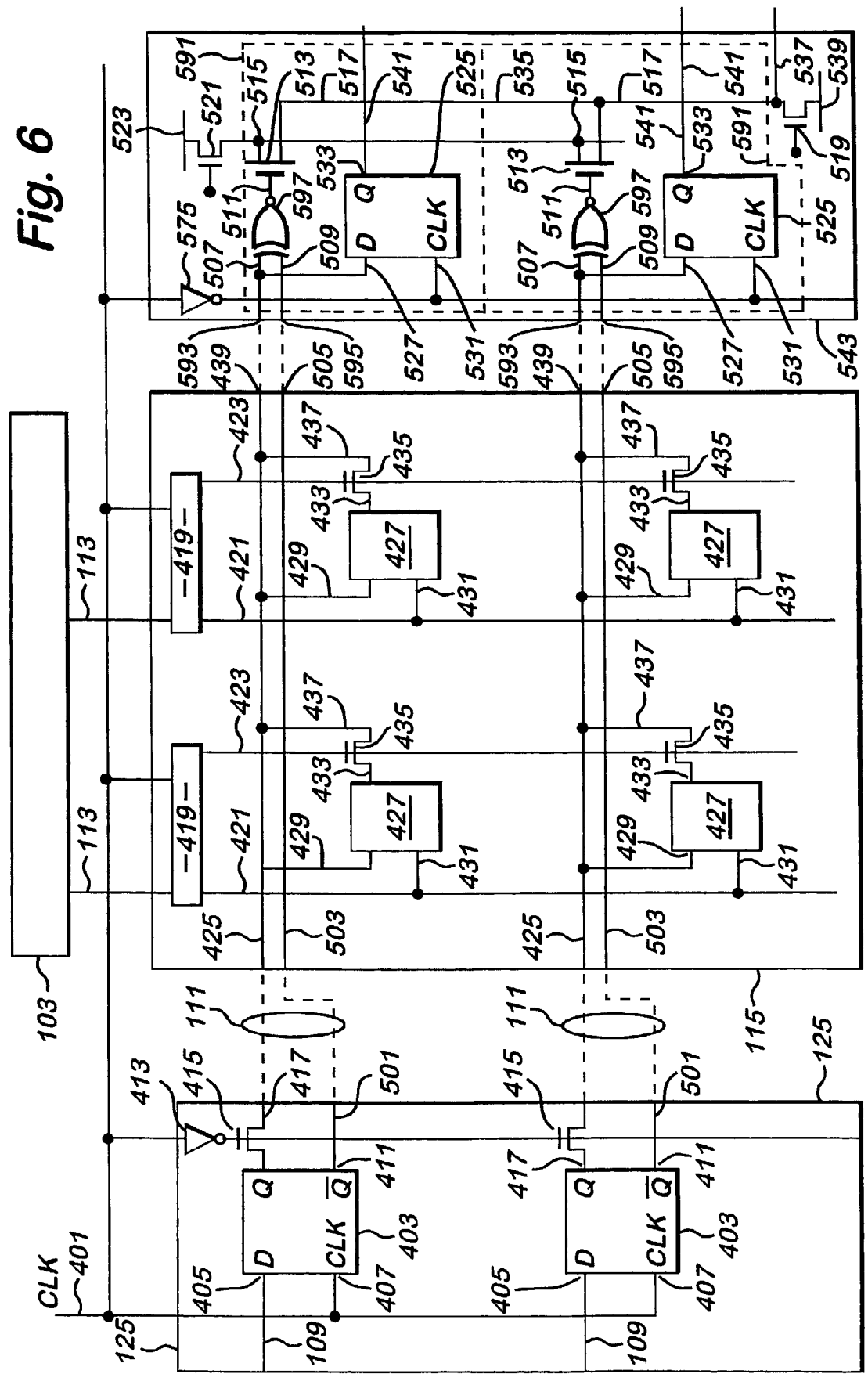
FIG. 6 shows a switch matrix incorporating an embodiment of the present invention and capable of being implemented in the logic device of FIGS. 2 and 3.

FIG. 6 shows an embodiment of the invention whereby the FPD 1 configuration is tested at the same time as it is written to. Embodiments of the present invention may be an FPD having circuitry similar to that described in FIG. 4, but further arranged to use the second configuration register latch output 411. The elements of FIG. 6 which are the same as in the preceding figures are referenced by the same reference numbers.

The second outputs 411 of the configuration registers 403 are output as a second plurality of configuration data lines, running parallel to the first set of configuration data lines and jointly called the configuration data lines 111.

The switch matrix 115 of FIG. 6 may further include a plurality of second configuration data inputs, and switch matrix configuration data lines 503. The switch matrix configuration lines 503 are connected on one side of the switch matrix 115 to the second set of configuration lines ill and on the opposite side are connected to a second set of outputs 505.

The embodiment of the present invention of FIG. 6 may further include an error detection block 543. This may be located in the configuration block or at the end of the processing block.

The error detection block 543 may be of a single column of row elements 591, a pull-up device 521, a pull down device 519, and a first output 537. Each row element 591 may include a first test data input 593, a second test data input 595, an Exclusive-NOR (XNOR) gate 597, a transistor switch 513, an error detection latch 525 and a second series of outputs 541.

The first test data input 593 is connected to a switch matrix output line 439, the second test data input 595 is connected to a second switch matrix output line 505. Each row 591 of the error detection block 543 is arranged whereby both test data input lines are from the same row of switch matrix elements.

Each XNOR gate 597 may include a first input 507 connected to the first test data input 593, a second input 509 connected to the second test data input 595, and an output 511.

Each error detection latch 525 may include a first data input connected to the first test data input 593, a second enable input connected to the inverted clock signal as supplied by passing the clock signal 401 through inverter 575, and an output 541.

Each element transistor switch 513 may include a gate connected to the output of the XNOR gate 597, one of the conduction terminals connected to the common pull-up device 521 and the other conduction terminal connected to the common pull-down device 519.

The test block output 537 is connected to the top terminal of the pull down device 519.

The pull-up device 521 and pull-down device 519 are arranged such that the pull-up device 521 is much stronger than the pull-down device 519, so that if a single transistor conducts the current from the pull up device 521 to the test block output 537, the output 537 is pulled up to a high reference voltage 523. Otherwise, the test block output 537 remains pulled low.

This circuitry of FIG. 6 now enables the configuration mode to be incorporated into a comprehensive test scheme. This scheme may include four steps: a scan test, a clock low test, a clock high test and an additional error location test.

Figure 7:
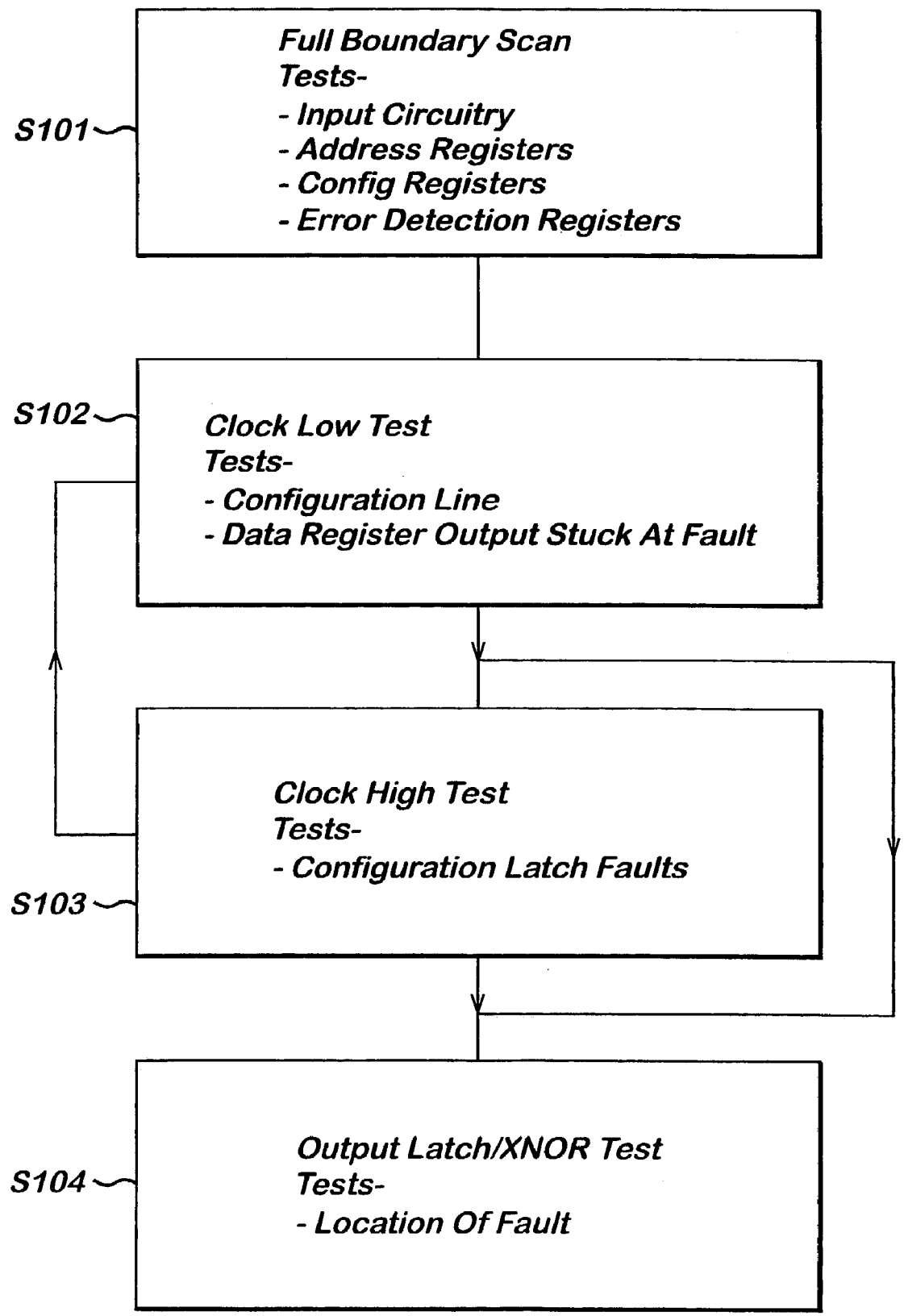
FIG. 7 shows a flow diagram showing a test method incorporating an embodiment of the present invention.

Referring to FIG. 7, the first step S101, the scan test, may include employing a scan of the chip. A scan is a method of detecting hardware errors by passing a series of test signals into the input of the circuit and monitoring a series of nodes in the FPD. This is carried out prior to the configuration mode and can be used to test for faults in input circuitry to the configuration data registers, the address registers and any input/output registers. Step S101 may be a boundary scan test that tests the input/output (I/O) connections and I/O circuitry of the FPD.

The second step S102, is taken during configuration when the clock signal 401 is low. During this step, the configuration data registers 125 output the values Q onto the configuration data lines 111 and the inverted value /Q onto the second set of configuration data lines 111. The values Q are loaded into the selected configuration latches 427, and are also passed as the first inputs 593 into the error detection block 543. The second input 595 into the error detection block 540 receives the inverted values /Q of configuration data registers 125. If these two inputs 593,595 of each row element 591 are the same an error has occurred. The expected inputs 593,595 of each row element 591 should be Q and /Q of the corresponding data configuration latch 403, respectively, but in order that the values are the same, one of the values has been corrupted and is wrong. This fault can be detected by the corresponding XNOR gate 597, which produces a high output when both inputs are the same. When the output of an XNOR gate 597 goes high, the corresponding switch transistor 513 is closed connecting the pull-up 521 device and pull-down device 519. As the pull-up device 521 is stronger than the pull-down device 519, the error detection block output 537 is brought high, indicating an error. This test is aimed at detecting stuck-at faults associated with configuration lines 111 and/or data configuration latches 403.

A stuck-at fault occurs when a tested node is connected to a voltage level due to some fault in the circuit. It is therefore incapable of changing its voltage level. The fault is that the node is stuck at the voltage level independent of the expected voltage.

The third step S103 occurs when the clock signal 401 is high. During this step, the configuration register output Q from each data configuration latch 403 is isolated from the configuration data line 111 by the corresponding configuration register switch 415. Instead, the output of the selected configuration latch 427 is output onto the switch matrix configuration data line 425 via the corresponding switch matrix switch 435. Thus the error detection block 7 first input 593 is the output of the selected configuration latch 427. The error detection block 543 second input 595 is the inverted output /Q of the data configuration register latch 403.

As in the previous step, if the two inputs 593,595 of a row 591 of error detection block 543 are the same, the corresponding XNOR gate 597 activates the corresponding transistor switch 513, which connects the pull-up and pull-down devices, thereby bringing the error detection block output 537 high and indicating an error. This test is aimed at detecting faults within the configuration latch.

These two steps S102, S103 are repeated until either the configuration/testing routine is complete or the error detection block output 537 indicates an error has been found. If an error is detected, the output 541 of the error detection block latches 525 can be used and compared against the original configuration data to determine the exact location of the fault. In a further embodiment of the present invention, the outputs 511 of the XNOR gates 597 are used to locate the fault rather than use the error detection block latch outputs 537.

After detection and location of a fault, resolution methods may be employed to reject the FPD or to compensate for the fault without rejection of the whole FPD.

Therefore, embodiments of the present invention describe a method for testing to be carried out at the same time as configuration.

Figure 8:
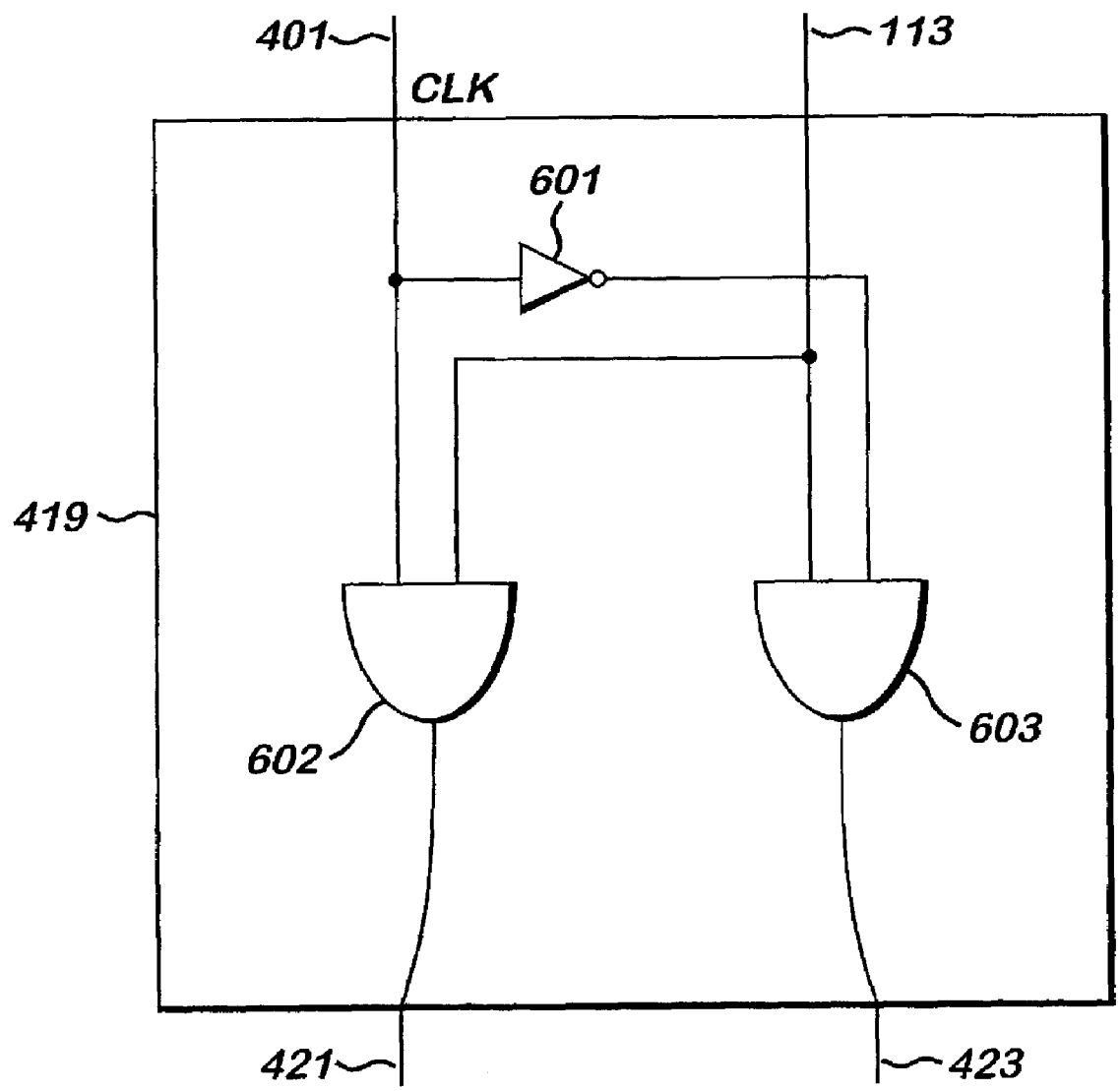
FIG. 8 shows in further detail the enable generation circuit of FIGS. 4 and 6.

FIG. 8 shows the enable generation circuitry 419. The enable generation circuitry 419 may include a clock input connected to clock line 401, an enable input connected to the address line 113, a first logic AND gate 602, a second logic AND gate 603, a logic inverter gate 601, an enable input output 421 and an enable output output 423. The first logic AND 602 gate may include a first input connected to the clock input and a second input connected to the enable input and an output connected to the enable input output 421. The second logic AND gate 603 may include a first input connected to an inverted clock input as provided by logic inverter gate 601, a second input connected to the enable input, and an output connected to the enable output output 423.

In operation, the enable generation circuit 419 outputs operate to pass the clock signed 401 and its logical inversion only when selected by the address register. When the circuit 419 is selected by enable signed 413 being in a logic high state, the two outputs of enable generation circuit 419 are opposite to each other, with each output value dependent on the value of the clock signal 401.

The embodiments of the present invention described above feature the advantages of being able to write configuration data at practically the same time as testing the configuration cycle. The embodiments of the present invention also feature the ability to locate and potentially remedy any error in the configuration cycle.

Embodiments of the present invention may be applied not only to configuration elements in a switch matrix but also to configuration elements in other parts of a FPD which contain configurable elements.

Although exemplary embodiments of the method and apparatus of the present invention have been illustrated in the accompanying Drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A field programmable device comprising:
a plurality of logic blocks;
a plurality of connections connecting said logic blocks wherein each row of logic blocks is connected by a pair of connections spanning the row of logic blocks;
configuration means for outputting configuration data for programming said field programmable device, said configuration means providing at least one pair of outputs coupled to each pair of connections; and
error detection means for comparing data on said pair of connections during configuration means outputting of the configuration data to determine if there has been a configuration error.

2. A device as claimed in claim 1, wherein said pair of connections comprises a first connection that is input and output coupled to a switching matrix configuration latch and a second connection bypassing each configuration latch, and wherein said error detection means comprises means for comparing data on said first connection driven by configuration latch state to data on said second connection.

3. A device as claimed in claim 2, wherein said comparing means comprises a logic XNOR gate.

4. A device as claimed in claim 1, wherein said error detection means are arranged to determine the presence of an error if data on a pair of connections are determined to be the same.

5. A device as claimed in claim 1, wherein said error detection means comprises at least one transistor arranged to provide a predetermined output when an error is determined.

6. A device as claimed in claim 5, wherein said at least one transistor comprises a pull-up transistor.

7. A device as claimed in claim 1, wherein said at least one pair of outputs comprise a signal and its inverse.

8. A device as claimed in claim 1, wherein said error detection means is arranged to determine errors in a first part of said device and then to determine errors on a second part of said device.

9. A device as claimed in claim 8, wherein said error detection means is arranged to determine errors in the first part when a clock signal to the device has a first state and to determine errors in the second part when the clock signal has a second state.

10. A device as claimed in claim 9, wherein one of said first and second parts of said device comprises the outputs of said configuration means.

11. A device as claimed in claim 9, wherein one of said first and second parts of said device comprises said plurality of connections.

12. A device as claimed in claim 1, wherein at least one of said logic blocks and said plurality of connections are configurable.

13. A device as claimed in claim 1, wherein said error detection means is arranged to determine the location of an error.

14. A device as claimed in claim 13, wherein said error detection means comprises means for providing an output for each row of said device.

15. A device as claimed in claim 14, wherein said means for providing an output for each row comprise storage means.

16. A device as claimed in claim 15, wherein said means for providing an output for each row compares said at least one pair of outputs.

17. A field programmable device comprising:
a plurality of logic blocks;
at least one switching matrix for controlling connections between the logic blocks;
configuration circuitry coupled to the at least one switching matrix, for configuring the at least one switching matrix, said configuration circuitry providing at least one pair of outputs spanning each row of the plurality of logic blocks, at least a first output of the pair of outputs used in configuring a latch of the switching matrix along the row, and for connection to an output of the latch of the switching matrix; and test circuitry coupled to compare the at least one pair of outputs of the configuration circuitry for testing the field programmable logic device during the time the switching matrix is being configured to control the connections between the logic blocks.

18. The field programmable logic device of claim 17, wherein:
the at least one switching matrix comprises at least one storage element having an output that controls whether two data lines in the at least one switching matrix are connected together;
the configuration circuitry comprises at least one configuration register element having at least one configuration output coupled to at least one input of the at least one switching matrix; and
the test circuitry compares the output of the at least one storage element and the at least one configuration output and generates a test output signal having a value indicative of a configuration error.

19. The field programmable logic device of claim 17, wherein:
the at least one switching matrix comprises a plurality of storage elements, each storage element having an output that controls whether two data lines in the at least one switching matrix are to be connected together;
the configuration circuitry comprises a plurality of configuration register elements, each configuration register element having a configuration output coupled to an input of the at least one switching matrix; and
the test circuitry compares the output of the storage elements and the configuration outputs and generates a test output signal having a value indicative of a configuration error.

20. The field programmable logic device of claim 19, wherein the test circuitry comprises a plurality of exclusive OR/NOR logic gates, an output of each of the exclusive OR/NOR logic gates capable of pulling the test output signal to a voltage representative of a predetermined logic level indicative of a configuration error.

21. The field programmable logic device of claim 20, wherein the test circuitry further comprises a plurality of transistors, each transistor having a control terminal coupled to the output of a distinct exclusive OR/NOR logic gate and a conduction terminal coupled to the test output signal.

22. The field programmable logic device of claim 19, wherein the test circuitry further comprises a plurality of storage components, each storage component having a data input coupled to an input of a distinct exclusive OR/NOR logic gate and a data output.

23. The field programmable logic device of claim 17, wherein:
the at least one switching matrix comprises at least one storage element having an output for controlling whether two data lines in the at least one switching matrix are connected together;
the configuration circuitry comprises at least one configuration output coupled to at least one input of the at least one switching matrix; and
the test circuitry compares the at least one configuration output with the output of the at least one storage element and generates a test output signal having a value indicative of a configuration error.

24. A field programmable device comprising:
a first block comprising a plurality of logic blocks, and a plurality of connections connecting said blocks;
configuration means for outputting configuration data for programming said device, wherein said configuration means provides at least one pair of outputs, a first output of said one pair of outputs is output onto one of a first set of configuration data lines, and a second output of said one pair of outputs is output onto one of a second set of configuration data lines, said configuration data lines spanning said first block; and
error detection means connected to an output of said one of said first set of configuration data lines, and to an output of said one of said second set of configuration data lines, said one of said first set and said one of said second set being from the same row, said error detection means arranged to compare said configuration data line outputs from the same row to determine if there has been a configuration error.

25. A device as claimed in claim 24, wherein said first set of data configuration lines is input and output coupled to a switching matrix configuration latch and said second set of data configuration lines bypasses each configuration latch, and wherein said error detection means comprises means for comparing data on said first set of data configuration lines driven by configuration latch state to data on said second set of data configuration lines.

26. A device as claimed in claim 25, wherein said comparing means comprises a logic XNOR gate.

27. A device as claimed in claim 24, wherein said error detection means are arranged to determine the presence of an error if a pair of outputs are determined to be the same.

28. A device as claimed in claim 24, wherein said error detection means comprises at least one transistor arranged to provide a predetermined output when an error is determined.

29. A device as claimed in claim 28, wherein said at least one transistor comprises a pull-up transistor.

30. A device as claimed in claim 24, wherein said at least one pair of outputs comprise a signal and its inverse.

31. A device as claimed in claim 24, wherein said error detection means is arranged to determine errors in a first part of said device and then to determine errors on a second part of said device.

32. A device as claimed in claim 31, wherein said error detection means is arranged to determine errors in the first part when a clock signal to the device has a first state and to determine errors in the second part when the clock signal has a second state.

33. A device as claimed in claim 32, wherein one of said first and second parts of said device comprises the outputs of said configuration means.

34. A device as claimed in claim 32, wherein one of said first and second parts of said device comprises said plurality of connections.

35. A device as claimed in claim 24, wherein at least one of said logic blocks and said plurality of connection means are configurable.

36. A device as claimed in claim 24, wherein said error detection means is arranged to determine the location of an error.

37. A device as claimed in claim 36, wherein said error detection means comprises means for providing an output for each row of said device.

38. A device as claimed in claim 37, wherein said means for providing an output for each row comprise storage means.

39. A device as claimed in claim 38, wherein said means for providing an output for each row compares said at least one pair of outputs.

40. A field programmable device comprising:

a plurality of logic blocks;

a plurality of connections connecting said blocks wherein each row of logic blocks is connected by a pair of connections spanning the row of logic blocks;

configuration circuitry for outputting configuration data for programming said device, said configuration circuitry providing at least one pair of outputs coupled to each pair of connections; and error detection circuitry for comparing data on said pair of connections during configuration to determine if there has been a configuration error.

41. A field programmable device comprising:

a first block comprising a plurality of logic blocks, and a plurality of connections connecting said blocks;

configuration circuitry for outputting configuration data for programming said device, wherein said configuration circuitry provides at least one pair of outputs, a first output of said one pair of outputs is output onto one of a first set of configuration data lines, and a second output of said one pair of outputs is output onto one of a second set of configuration data lines, said configuration data lines spanning said first block; and error detection circuitry connected to an output of said one of said first set of configuration data lines, and to an output of said one of said second set of configuration data lines, said one of said first set and said one of said second set being from the same row, said error detection circuitry being arranged to compare said configuration data line outputs from the same row to determine if there has been a configuration error.

\* \* \* \* \*